(12) United States Patent
Honjo et al.

(10) Patent No.: US 11,476,314 B2
(45) Date of Patent: Oct. 18, 2022

(54) DISPLAY DEVICE AND PRODUCTION METHOD FOR DISPLAY DEVICE

(71) Applicant: SHARP KABUSHIKI KAISHA, Sakai (JP)

(72) Inventors: Masatomo Honjo, Sakai (JP); Hiroshi Matsukizono, Sakai (JP); Takuya Matsuo, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 65 days.

(21) Appl. No.: 17/040,909

(22) PCT Filed: Mar. 29, 2018

(86) PCT No.: PCT/JP2018/013346
§ 371 (c)(1),
(2) Date: Sep. 23, 2020

(87) PCT Pub. No.: WO2019/186924
PCT Pub. Date: Oct. 3, 2019

(65) Prior Publication Data
US 2021/0013282 A1 Jan. 14, 2021

(51) Int. Cl.
*H01L 27/00* (2006.01)
*H01L 29/00* (2006.01)
(Continued)

(52) U.S. Cl.
CPC ........ *H01L 27/3262* (2013.01); *H01L 27/127* (2013.01); *H01L 27/1225* (2013.01);
(Continued)

(58) Field of Classification Search
CPC ............. H01L 27/3262; H01L 27/1225; H01L 27/1251; H01L 27/127; H01L 29/66757;
(Continued)

(56) References Cited

U.S. PATENT DOCUMENTS

| 2016/0247831 A1* | 8/2016 | Makita ................ H01L 27/1248 |
| 2016/0322395 A1 | 11/2016 | Koezuka et al. |
| 2019/0273168 A1* | 9/2019 | Matsukizono ............ G09F 9/30 |

FOREIGN PATENT DOCUMENTS

JP 2016-213454 A 12/2016

* cited by examiner

*Primary Examiner* — Nikolay K Yushin
(74) *Attorney, Agent, or Firm* — ScienBiziP, P.C.

(57) ABSTRACT

A display device according to the disclosure includes a substrate, a first transistor provided on the substrate, and a second transistor provided on the substrate, not overlapping the first transistor. The first transistor includes a polycrystalline silicon layer provided on the substrate, a first insulating film provided on the polycrystalline silicon layer, a first gate electrode provided on the first insulating film, and a second insulating film provided on the first gate electrode. The second transistor includes an oxide semiconductor layer provided on the first insulating film, a third insulating film provided on the oxide semiconductor layer, and a second gate electrode provided on the third insulating film. The first and third insulating films are SiOx films. The second insulating film is an SiNx film including hydrogen, and is provided overlapping the polycrystalline silicon layer, and is provided not overlapping the oxide semiconductor layer.

9 Claims, 4 Drawing Sheets

(51) Int. Cl.
*H01L 27/32* (2006.01)
*H01L 27/12* (2006.01)
*H01L 29/66* (2006.01)
*H01L 29/786* (2006.01)

(52) U.S. Cl.
CPC .... *H01L 27/1251* (2013.01); *H01L 29/66757* (2013.01); *H01L 29/66969* (2013.01); *H01L 29/7869* (2013.01); *H01L 29/78648* (2013.01); *H01L 29/78675* (2013.01); *H01L 2227/323* (2013.01)

(58) Field of Classification Search
CPC ......... H01L 29/66969; H01L 29/78648; H01L 29/78675; H01L 29/7869; H01L 2227/323; H01L 27/1237; H01L 2227/3262; H01L 2227/32
See application file for complete search history.

DISPLAY DEVICE AND PRODUCTION METHOD FOR DISPLAY DEVICE

TECHNICAL FIELD

The disclosure relates to a display device and a method for manufacturing the display device.

BACKGROUND ART

A display device includes a pixel circuit provided with a plurality of pixels disposed in a matrix shape and configured to control the plurality of pixels on a pixel-by-pixel basis. Further, there have been known pixel circuits that include a plurality of thin film transistors (refer to, for example, PTL 1).

In a pixel circuit of a display device, typically any one of an amorphous silicon thin film transistor (a-Si TFT), a low-temperature polysilicon thin film transistor (LTPS TFT), and an oxide semiconductor thin film transistor (oxide semiconductor TFT) is used. These thin film transistors each have different characteristics. The LTPS TFT has a characteristic of having an electron mobility greater than that of the a-Si TFT and the oxide semiconductor TFT. The oxide semiconductor TFT has a characteristic of having a leakage current less than that of the a-Si TFT and the LTPS TFT.

In a case where the pixel circuit includes a plurality of thin film transistors, the plurality of thin film transistors used are thin film transistors of the same type. This makes it possible to generate the plurality of thin film transistors in the same process, and thus reduce manufacturing costs.

CITATION LIST

Patent Literature

PTL 1: JP 2016-213454 A

SUMMARY

Technical Problem

A drive transistor, a selecting transistor, and the like included in the pixel circuit have different functions. Therefore, when the same type of thin film transistor is used as these thin film transistors, it is difficult to impart appropriate characteristics to each thin film transistor.

The disclosure has been made in view of such circumstances, and an object of the disclosure is to provide a display device that includes both a low-temperature polysilicon thin film transistor (LTPS TFT) and an oxide semiconductor thin film transistor, and is capable of properly driving these thin film transistors.

Solution to Problem

The disclosure provides a display device including a substrate, a first transistor provided on the substrate, and a second transistor provided on the substrate, not overlapping the first transistor. The first transistor includes a polycrystalline silicon layer provided on the substrate, a first insulating film provided on the polycrystalline silicon layer, a first gate electrode provided on the first insulating film, and a second insulating film provided on the first gate electrode. The second transistor includes an oxide semiconductor layer provided on the first insulating film, a third insulating film provided on the oxide semiconductor layer, and a second gate electrode provided on the third insulating film. The first insulating film and the third insulating film are SiOx films, and the second insulating film is an SiNx film including hydrogen, is provided overlapping the polycrystalline silicon layer, and is provided not overlapping the oxide semiconductor layer.

Advantageous Effects of Disclosure

The display device according to the disclosure includes the first transistor including the polycrystalline silicon layer and the second transistor including the oxide semiconductor layer. This makes it possible to utilize characteristics of a low-temperature polysilicon thin film transistor and characteristics of an oxide semiconductor thin film transistor to configure an electrical circuit of the display device, and thus improve the characteristics of the display device.

The polycrystalline silicon layer included in the first transistor is provided overlapping the SiNx film including hydrogen (second insulating film). This makes it possible to appropriately hydrogenate the polycrystalline silicon layer and properly drive the first transistor.

The oxide semiconductor layer included in the second transistor is provided not overlapping the SiNx film including hydrogen (second insulating film). This makes it possible to reduce the oxide semiconductor layer by the hydrogen included in the SiNx film and suppress changes in an electrical resistivity of the oxide semiconductor layer, and properly drive the second transistor.

DESCRIPTION OF EMBODIMENTS

Figure 1:
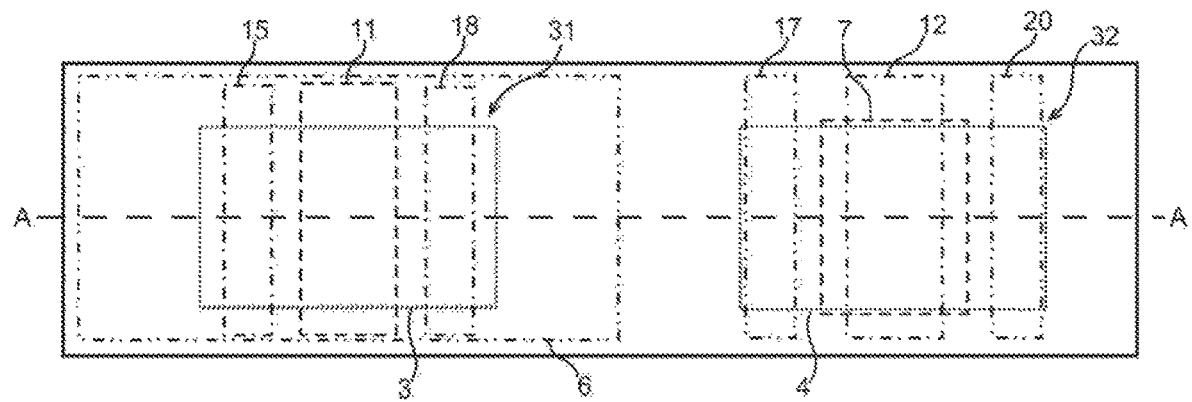
FIG. 1 is a schematic top view illustrating a configuration of a first transistor and a second transistor included in a display device according to an embodiment of the disclosure.

A display device according to the disclosure includes a substrate, a first transistor provided on the substrate, and a second transistor provided on the substrate, not overlapping the first transistor. The first transistor includes a polycrystalline silicon layer provided on the substrate, a first insulating film provided on the polycrystalline silicon layer, a first gate electrode provided on the first insulating film, and a second insulating film provided on the first gate electrode. The second transistor includes an oxide semiconductor layer provided on the first insulating film, a third insulating film provided on the oxide semiconductor layer, and a second gate electrode provided on the third insulating film. The first insulating film and the third insulating film are SiOx films, and the second insulating film is an SiNx film including hydrogen, is provided overlapping the polycrystalline silicon layer, and is provided not overlapping the oxide semiconductor layer.

The display device according to the disclosure is not particularly limited as long as the device is a display panel including display elements. The display element is a display element of which luminance and transmittance are controlled by a current, and examples of the current-controlled display element include an organic electroluminescent (EL) display provided with an organic light-emitting diode (OLED), an EL display such as an inorganic EL display provided with an inorganic light-emitting diode, a quantum dot light-emitting diode (QLED) display provided with a QLED, and the like.

The first and second transistors may be included in a pixel circuit. Further, in a case where the display device according to the disclosure includes a gate driver, the first and second transistors may be included in the gate driver. Further, one of the first and second transistors may be included in the pixel circuit, and the other may be included in the gate driver.

The display device according to the disclosure preferably further includes a fourth insulating film provided on the second insulating film and on the second gate electrode. The first transistor preferably further includes a first source electrode connected to the polycrystalline silicon layer and a first drain electrode connected to the polycrystalline silicon layer. The first source electrode is preferably provided to a first contact hole passing through the first insulating film, the second insulating film, and the fourth insulating film. The first drain electrode is preferably provided to a second contact hole passing through the first insulating film, the second insulating film, and the fourth insulating film. This allows a source-drain current to flow to the polycrystalline silicon layer when the first transistor is in an on state.

The display device according to the disclosure preferably further includes a protection film provided on the fourth insulating film. The first transistor preferably further includes a second source electrode connected to the first source electrode and a second drain electrode connected to the first drain electrode. The second source electrode is preferably provided to a third contact hole passing through the protection film. The second drain electrode is preferably provided to a fourth contact hole passing through the protection film.

The second transistor preferably further includes a third source electrode connected to the oxide semiconductor layer and a third drain electrode connected to the oxide semiconductor layer. The third source electrode is preferably provided to a fifth contact hole passing through the fourth insulating film and the protection film. The third drain electrode is preferably provided to a sixth contact hole passing through the fourth insulating film and the protection film. This allows a source-drain current to flow to the oxide semiconductor layer when the second transistor is in an on state.

The display device according to the disclosure preferably further includes a fifth insulating film provided on the first insulating film. The oxide semiconductor layer is preferably provided on the fifth insulating film. The second transistor preferably further includes a third gate electrode provided between the first insulating film and the fifth insulating film. This allows the second transistor to have a double gate structure and the source-drain current to be increased.

The second gate electrode is preferably provided with a position of the second gate electrode being aligned with a position of the third insulating film. This makes it possible to pattern the second gate electrode and the third insulating film using the same photoresist, and reduce manufacturing costs.

The second insulating film is preferably provided in an island shape at a position of the first transistor. This makes it possible to suppress an effect of the hydrogen included in the second insulating film on the oxide semiconductor layer of the second transistor.

The display device according to the disclosure preferably further includes a plurality of pixel circuits.

Each of the plurality of pixel circuits preferably includes the first transistor, and the first transistor is preferably a drive transistor. This makes it possible to use an LTPS TFT having a large electron mobility as the drive transistor, and adjust a brightness of the pixels and control a color tone of the pixels with high accuracy.

Each of the plurality of pixel circuits preferably further includes the second transistor, and the second transistor preferably includes a conduction terminal connected to a control terminal of the first transistor. This makes it possible to use an oxide semiconductor TFT having little leakage current as a selecting transistor, and reduce a power consumption of the display device.

The disclosure provides a method for manufacturing a display device, including the step of forming a first transistor and a second transistor on a substrate. The step of forming the first transistor and the second transistor includes the steps of forming a polycrystalline silicon layer on the substrate, forming a first insulating film on the polycrystalline silicon layer, forming a first gate electrode on the first insulating film, forming a second insulating film on the first gate electrode, forming an oxide semiconductor layer on the first insulating film, forming a third insulating film on the oxide semiconductor layer, and forming a second gate electrode on the third insulating film. The polycrystalline silicon layer is a layer with a channel of the first transistor formed therein, the oxide semiconductor layer is a layer with a channel of the second transistor formed therein, the first insulating film and the third insulating film are SiOx films, the second insulating film is an SiNx film including hydrogen, and the oxide semiconductor layer is formed not overlapping the second insulating film.

The method for manufacturing a display device according to the disclosure preferably further includes a step of forming a third gate electrode and a fifth insulating film, in this order, on the first insulating film. The oxide semiconductor layer is preferably formed directly above the third gate electrode and the fifth insulating film.

The disclosure will be described in further detail below with reference to a plurality of embodiments. The drawings and configurations illustrated in the following description are exemplary, and the scope of the disclosure is not limited to the drawings and the description below.

First Embodiment

Figure 2:
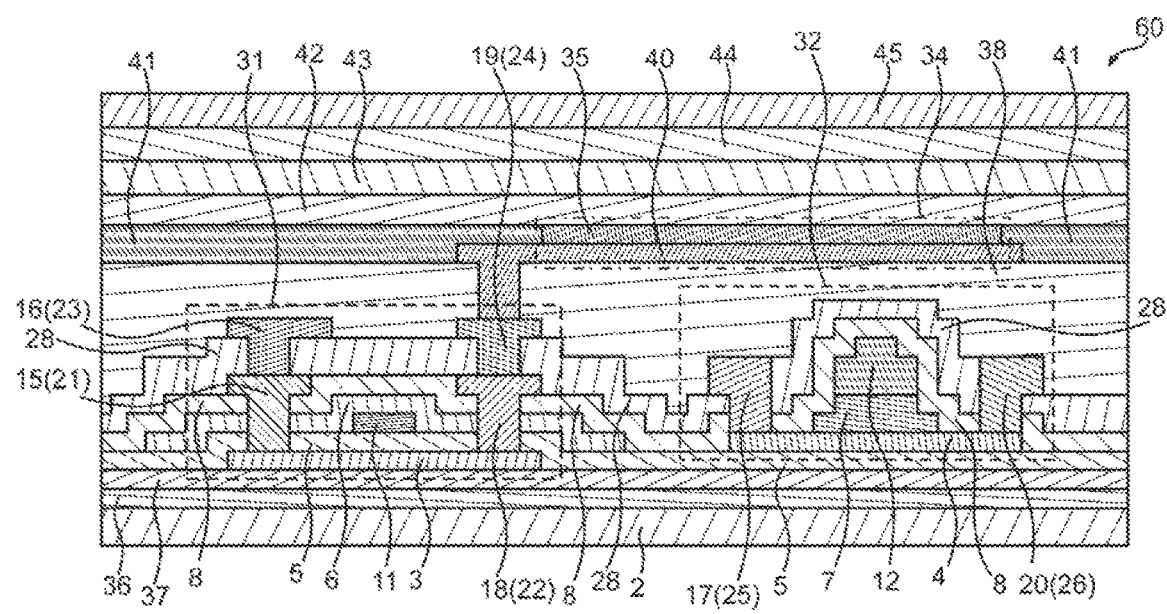
FIG. 2 is a schematic cross-sectional view of the display device, taken along the dashed line A-A in FIG. 1.
Figure 3:
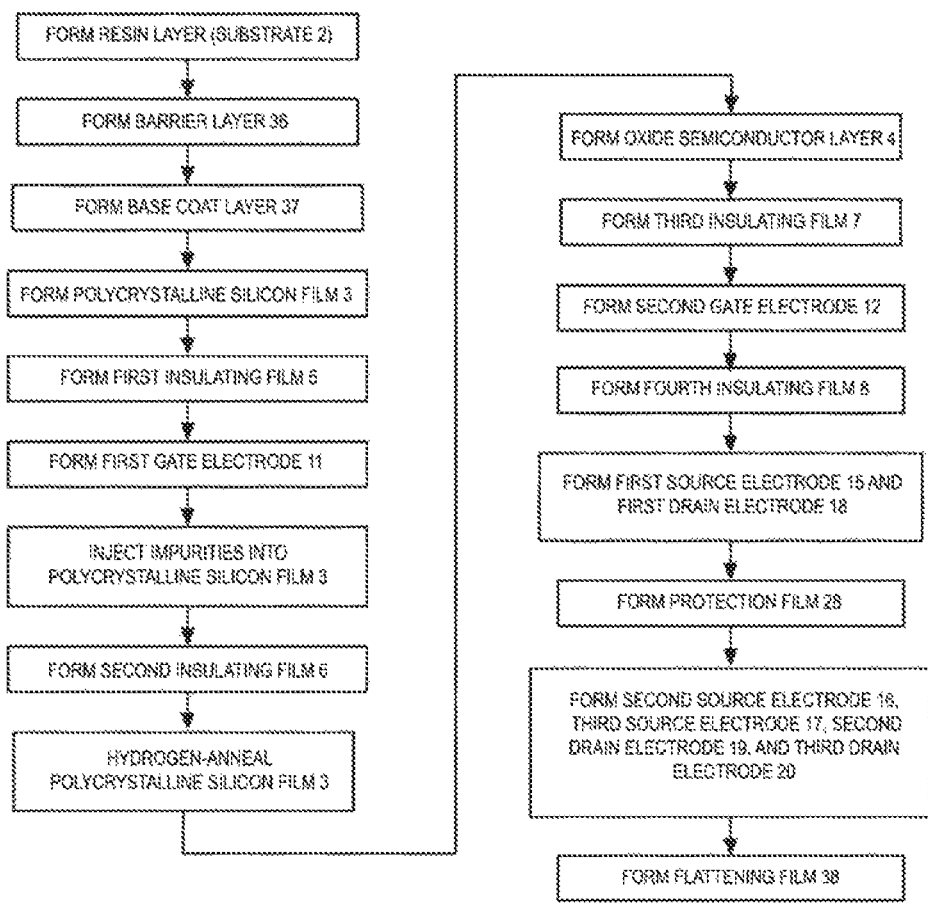
FIG. 3 is a flowchart illustrating a manufacturing process of the first and second transistors included in the display device according to an embodiment of the disclosure-.
Figure 4:
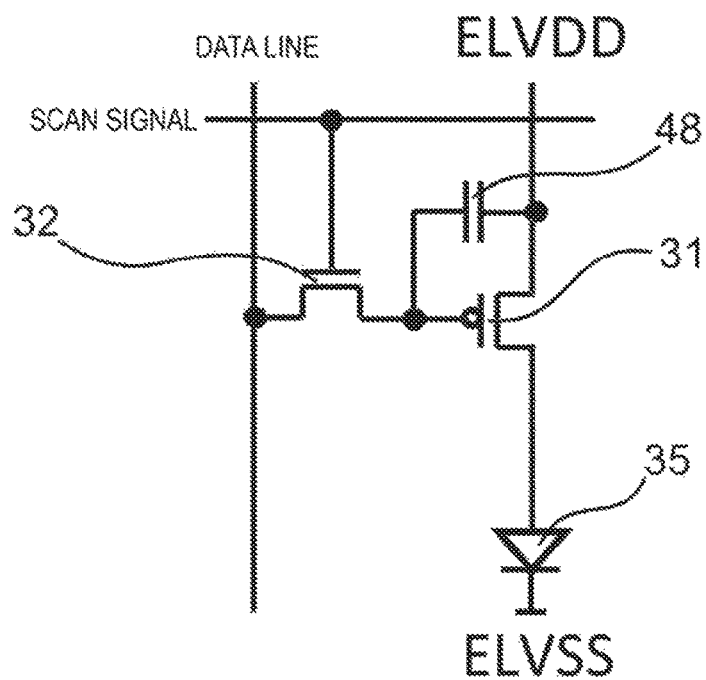
FIG. 4 is a circuit diagram of a pixel circuit included in the display device of an embodiment of the present embodiment.

FIG. 1 is a schematic top view illustrating a configuration of a first transistor and a second transistor included in a display device according to the present embodiment, and FIG. 2 is a schematic cross-sectional view of the display device, taken along the dashed line A-A in FIG. 1. FIG. 3 is a flowchart illustrating a manufacturing process of the first and second transistors, and FIG. 4 is a circuit diagram of a pixel circuit including the first and second transistors.

A display device 60 of the present embodiment includes a substrate 2, a first transistor 31 provided on the substrate 2, and a second transistor 32 provided on the substrate 2, not overlapping the first transistor 31. The first transistor 31 includes a polycrystalline silicon layer 3 provided on the substrate 2, a first insulating film 5 provided on the polycrystalline silicon layer 3, a first gate electrode 11 provided on the first insulating film 5, and a second insulating film 6 provided on the first gate electrode 11. The second transistor 32 includes an oxide semiconductor layer 4 provided on the first insulating film 5, a third insulating film 7 provided on the oxide semiconductor layer 4, and a second gate electrode 12 provided on the third insulating film 7. The first insulating film 5 and the third insulating film 7 are SiOx films, and the second insulating film 6 is an SiNx film including hydrogen, is provided overlapping the polycrystalline silicon layer 5, and is provided not overlapping the oxide semiconductor layer 4.

A method for manufacturing the display device 60 of the present embodiment includes the step of forming the first transistor 31 and the second transistor 32 on the substrate 2. The step of forming the first transistor 31 and the second transistor 32 includes the steps of forming the polycrystalline silicon layer 3 on the substrate 2, forming the first insulating film 5 on the polycrystalline silicon layer 3, forming the first gate electrode 11 on the first insulating film 5, forming the second insulating film 6 on the first gate electrode 11, forming the oxide semiconductor layer 4 on the first insulating film 5, forming the third insulating film 7 on the oxide semiconductor layer 4, and forming the second gate electrode 12 on the third insulating film 7. The polycrystalline silicon layer 3 is a layer with a channel of the first transistor 31 formed therein, the oxide semiconductor layer 4 is a layer with a channel of the second transistor 32 formed therein, the first insulating film 5 and the third insulating film 7 are SiOx films, the second insulating film 6 is an SiNx film including hydrogen, and the oxide semiconductor layer 4 is formed not overlapping the second insulating film 6.

The display device 60 is, for example, an organic EL display, an inorganic EL display, or the like.

The substrate 2 is, for example, a flexible substrate, a glass substrate, or the like. Further, the substrate 2 is, for example, a polyimide substrate. In a case where the substrate 2 is a polyimide substrate, the substrate 2 (resin layer, polyimide layer) can be formed on a carrier substrate by applying a polyamic acid solution onto the carrier substrate and heat-treating the applied film at 200° C. to 500° C. in a baking furnace.

A barrier layer 36 and a base coat layer 37 can be provided, in this order, on the substrate 2 as a base insulating film. The barrier layer 36 is, for example, an $SiO_2$ film, an SiNx film, an $SiO_xN_y$ film (x>y), an $SiN_xO_y$ film (x>y), or the like. A thickness of the barrier layer 36 is, for example, 375 nm. The barrier layer 36 can be formed by, for example, plasma chemical vapor deposition (CVD). Further, the base coat layer 37 is, for example, an $SiN_x$ film, an $SiO_2$ film, an $SiO_xN_y$ film (x>y), an $SiN_xO_y$ film (x>y), or the like. The barrier layer 36 and the base coat layer 37 can be different types of insulating films.

The barrier layer 36 and base coat layer 37 are provided in both a region where the first transistor 31 is positioned and a region where the second transistor 32 is positioned, and are positioned below the first and second transistors 31, 32.

The display device 60 includes the first transistor 31 provided on the substrate 2, and the second transistor 32 provided on the substrate 2, not overlapping the first transistor 31.

The display device 60 includes a plurality of pixels arrayed in a matrix shape. Each pixel can include a pixel circuit constituted by the first transistor 31, the second transistor 32, a light-emitting element 34, and the like. The pixel circuit is a circuit that drives pixels. The display device 60 can include, for example, a pixel circuit such as illustrated in FIG. 4. Further, in a case where the pixel circuit includes three or more thin film transistors, the transistors other than the first and second transistors can be oxide semiconductor thin film transistors.

The first transistor 31 is a low-temperature polysilicon thin film transistor (LTPS TFT). Further, the first transistor 31 can be a p-channel type. The first transistor 31 includes the polycrystalline silicon layer 3 provided on the substrate 2, the first insulating film 5 provided on the polycrystalline silicon layer 3, the first gate electrode 11 provided on the first insulating film 5, the second insulating film 6 provided on the first gate electrode 11, a first source electrode 15 connected to the polycrystalline silicon layer 3, and a first drain electrode 18 connected to the polycrystalline silicon layer 3. Further, the first transistor 31 may have a top gate structure, or may have a double gate structure. The first transistor 31 can be a drive transistor connected to the light-emitting element 34. By using an LTPS TFT having a large electron mobility as the drive transistor, it is possible to adjust the brightness of the pixels and control the color tone of the pixels with high accuracy. For example, the first transistor 31 can be a drive transistor as in the pixel circuit illustrated in FIG. 4. The drive transistor is provided in series with the light-emitting element 34 and, with a data signal input to a control terminal thereof, controls an amount of current flowing to the light-emitting element 34. The control terminal is a terminal connected to a terminal of the gate electrode or the gate electrode. A source electrode or a drain electrode of the first transistor 31 can be connected to the light-emitting element 34.

The polycrystalline silicon layer 3 is a layer in which a channel of the first transistor 31 is formed. The polycrystalline silicon layer 3 can be formed by, for example, forming an amorphous silicon film on the base coat layer 37 by CVD, subjecting this amorphous silicon film to laser annealing to form a polycrystalline silicon film, and patterning the polycrystalline silicon film by a photolithographic method. The polycrystalline silicon layer 3 can include regions doped with n-type or p-type impurities. The impurities can be, for example, boron (b) and aluminum (Al).

The polycrystalline silicon layer 3 is subjected to a hydrogenation annealing treatment, as illustrated in the flowchart of FIG. 3. The hydrogenation annealing treatment can be, for example, a heat treatment at 300 to 450° C. for 1 to 12 hours in an atmosphere including 3 to 100% hydrogen. The hydrogenation annealing treatment makes it possible to bond hydrogen to a dangling bond of polysilicon included in the polycrystalline silicon layer 3, and stabilize the characteristics of the first transistor 31.

At the position of the first transistor 31, the first insulating film 5 is positioned between the polycrystalline silicon layer 3 and the first gate electrode 11, and becomes the gate insulating film. Further, at the position of the second transistor 32, the first insulating film 5 is positioned below the second transistor 32. The first insulating film 5 is an SiOx film (x>0). For example, the first insulating film 5 can be formed on the polycrystalline silicon layer 3 and on the base coat layer 37 by plasma CVD. A thickness of the first insulating film 5 can be, for example, 375 nm.

The first gate electrode 11 is provided directly above the polycrystalline silicon layer 3 and the first insulating film 5, and becomes a top gate electrode of the first transistor 31. A gate voltage is applied to the first gate electrode 11, thereby forming a channel in the polycrystalline silicon layer 3, turning the first transistor 31 to an on state, and causing current to flow between the source and the drain. The first gate electrode 11 is, for example, a titanium electrode, an aluminum electrode, a molybdenum electrode, a copper electrode, a molybdenum nitride film, or a layered electrode of these electrodes.

For example, the first gate electrode 11 of the first transistor 31 can be formed by forming a layered film including an Al film (thickness: 350 nm) as a lower layer and a MoN film (thickness: 50 nm) as an upper layer on the first insulating film 5 by sputtering, and patterning the layered film by a photolithographic method.

The second insulating film 6, a fourth insulating film 8, and a protection film 28 can be provided on the first gate electrode 11.

The second insulating film 6 is an SiNx film (x>0, x need not be an integer) including hydrogen, and is provided overlapping the polycrystalline silicon layer 3. Further, the second insulating film 6 is positioned above the first gate electrode 11 at the position of the first transistor 31. Further, the second insulating film 6 is patterned by a photolithography process, ensuring that the second insulating film 6 is not provided at the position of the second transistor 32. For example, the second insulating film 6 can be formed by forming a silicon nitride (SiNx) film (thickness: 375 nm) on the first gate electrode 11 and on the first insulating film 5 by plasma CVD, and patterning the silicon nitride (SiNx) film by a photolithographic method.

The hydrogenation annealing treatment described above is performed after formation of the second insulating film 6, as illustrated in the flowchart of FIG. 3. By using the SiNx film including hydrogen as the second insulating film 6, it is possible to efficiently supply hydrogen to the polycrystalline silicon layer 3 via the second insulating film 6 during the hydrogenation annealing treatment, and efficiently hydrogenate the polycrystalline silicon layer 3. The SiNx film including hydrogen can be formed by, for example, plasma CVD using $SiH_4$ and $N_2$ or $NH_3$ as a material gas.

The second insulating film 6 is provided not overlapping the oxide semiconductor layer 4 in which the channel of the second transistor 32 is formed. This makes it possible to prevent the hydrogen included in the second insulating film 6 from affecting the electrical resistivity of the oxide semiconductor layer 4. This will be described later. The second insulating film 6 can be provided in an island shape at the position of the first transistor 31. Further, the second insulating film 6 can be provided without being formed in the region where the second transistor 32 is positioned. The pattern of such a second insulating film 6 can be formed by a photolithography process.

The first source electrode 15 and the first drain electrode 18 are each connected to the polycrystalline silicon layer 3 and, when the first transistor 31 is in an on state, a voltage is applied to the polycrystalline silicon layer 3 between the first source electrode 15 and the first drain electrode 18, causing a source-drain current to flow. Each of the first source electrode 15 and the first drain electrode 18 is, for example, a layered film including a Ti film as a lower layer, an Al film as a main layer, and a Ti film as an upper layer, and is a titanium electrode, an aluminum electrode, or a copper electrode.

The first source electrode 15 can be provided to a first contact hole 21 passing through the first insulating film 5, the second insulating film 6, and the fourth insulating film 8. The first drain electrode 18 can be provided to a second contact hole 22 passing through the first insulating film 5, the second insulating film 6, and the fourth insulating film 8.

The first source electrode 15 and the first drain electrode 18 can be formed after formation of the fourth insulating film 8. For example, the first contact hole 21 and the second contact hole 22 are formed in the fourth insulating film 8, the second insulating film 6, and the first insulating film 5 on the source and drain regions of the polycrystalline silicon layer 3. The first source electrode 15 and the first drain electrode 18 can be formed by forming a layered film of titanium/aluminum/titanium on the fourth insulating film 8, within the first contact hole 21, and within the second contact hole 22 by sputtering, and patterning the layered film by a photolithographic method. For example, a layered film including a Ti film (thickness: 30 nm) as a lower layer, an Al film (thickness: 300 nm) as a main layer, and a Ti film (thickness: 50 nm) as an upper layer can be used.

A second source electrode 16 is an electrode connected to the first source electrode 15. Further, a second drain electrode 19 is an electrode connected to the first drain electrode 18. Each of the second source electrode 16 and the second drain electrode 19 is, for example, a titanium electrode, an aluminum electrode, or a copper electrode.

The second source electrode 16 can be provided to a third contact hole 23 passing through the protection film 28. The second drain electrode 19 can be provided to a fourth contact hole 24 passing through the protection film 28.

The second source electrode 16 and the second drain electrode 19 can be formed in the same process as a third source electrode 17 and a third drain electrode 20. This process will be described later.

The second transistor 32 is an oxide semiconductor thin film transistor (oxide semiconductor TFT). The second transistor 32 can be an n-channel. The second transistor 32 includes the oxide semiconductor layer 4 provided on the first insulating film 5, the third insulating film 7 provided on the oxide semiconductor layer 4, the second gate electrode 12 provided on the third insulating film 7, the third source electrode 17 connected to the oxide semiconductor layer 4, and the third drain electrode 20 connected to the oxide semiconductor layer 4.

The second transistor 32 can be a selecting transistor connected to the drive transistor (first transistor 31). By using an oxide semiconductor TFT having a low leakage current as the selecting transistor, it is possible to reduce the power consumption of the display device 60. For example, the second transistor 32 can be provided with the third drain electrode 20 of the second transistor 32 connected to the first gate electrode 11 of the first transistor, which is a drive transistor, as in the pixel circuit illustrated in FIG. 4. One of two conduction terminals of the selecting transistor is connected to a data line, and the other conduction terminal is connected to the control terminal of the drive transistor. The two conduction terminals of the transistor are terminals of the source electrode and the drain electrode.

The oxide semiconductor layer 4 is a layer in which a channel of the second transistor 32 is formed, and a current between the source and the drain flows to the oxide semiconductor layer 4. This current is controlled by the second gate electrode 12. The oxide semiconductor layer 4 can include In, Ga, Zn, Sn, W, Sr, Ti, or Ni. The oxide semiconductor layer 4 is, for example, an oxide semiconductor layer including In, Ga, and Zn, an oxide semiconductor layer including In, Sn, and Zn, an oxide semiconductor layer including a zinc oxide layer, In, and Zn, or the like. The oxide semiconductor layer 4 has an oxygen defect, and this oxygen defect functions as a donor. A thickness of the oxide semiconductor layer 4 is, for example, greater than or equal to 30 nm and less than or equal to 100 nm. For example, the oxide semiconductor layer 4 can be formed on the first insulating film 5 by forming an oxide semiconductor film on the second insulating film 6 and on the first insulating film 5 by sputtering, and patterning the oxide semiconductor film by a photolithographic method.

The oxide semiconductor layer 4 is provided not overlapping the second insulating film 6, which is an SiNx film including hydrogen. That is, the second insulating film 6 is not provided directly below or directly above the oxide semiconductor layer 4. This makes it possible to suppress the hydrogen included in the second insulating film 6 from entering the oxide semiconductor layer 4 and reducing the oxide semiconductor layer 4 in the manufacturing process, and suppress changes in an oxygen defect density of the oxide semiconductor layer 4. As a result, changes in the electrical resistivity of the oxide semiconductor layer 4 can be suppressed, and the second transistor 32 can be properly driven.

The third insulating film 7 is provided on the oxide semiconductor layer 4. Further, the third insulating film 7 can be provided in an island shape at the position of the second transistor 32. The pattern of the third insulating film 7 can be formed by a photolithography process. The third insulating film 7 functions as a gate insulating film of the top gate of the second transistor 32. The third insulating film 7 is an SiOx film.

For example, the third insulating film 7 can be formed by forming an $SiO_2$ film (thickness: 375 nm) on the oxide semiconductor layer 4, on the second insulating film 6, and on the first insulating film 5 by plasma CVD, and patterning the $SiO_2$ film by a photolithographic method.

The second gate electrode 12 is provided directly above the oxide semiconductor layer 4 and the third insulating film 7, and becomes the top gate electrode of the second transistor 32. A gate voltage is applied to the second gate electrode 12, thereby forming a channel in the oxide semiconductor layer 4, turning the second transistor 32 to an on state, and causing a current to flow between the source and the drain. The second gate electrode 12 is, for example, a titanium electrode, an aluminum electrode, a molybdenum electrode, or a copper electrode. For example, the second gate electrode 12 is formed by forming a layered film including an Al film (thickness: 350 nm) as a lower layer and a MoN film (thickness: 50 nm) as an upper layer on the third insulating film 7, on the oxide semiconductor layer 4, on the first insulating film 5, and on the second insulating film 6 by sputtering, and patterning the layered film by a photolithographic method.

The second gate electrode 12 can be provided with a position of the second gate electrode 12 being aligned with a position of the third insulating film 7. In this case, the second gate electrode 12 and the third insulating film 7 are patterned using the same photoresist.

The fourth insulating film 8 and the protection film 28 are provided above the second gate electrode 12.

The fourth insulating film 8 is positioned on the second insulating film 6 at the position of the first transistor 31, and is positioned above the second gate electrode 12 at the position of the second transistor 32. The fourth insulating film 8 is, for example, an SiOx film or an SiNx film. For example, the fourth insulating film 8 can be formed by forming an $SiO_2$ film (thickness: 375 nm) on the second gate electrode 12, on the third insulating film 7, on the oxide semiconductor layer 4, on the first insulating film 5, and on the second insulating film 6 by plasma CVD, and patterning the $SiO_2$ film by a photolithographic method.

The protection film 28 is positioned on the fourth insulating film 8 at the position of the first transistor 31, and is positioned above the fourth insulating film 8 at the position of the second transistor 32. The protection film 28 is, for example, an SiOx film or an SiNx film. For example, the protection film 28 can be formed by forming a silicon nitride (SiNx) film (thickness: 375 nm) on the first source electrode 15, the first drain electrode 18, and the fourth insulating film 8 by plasma CVD, and patterning the silicon nitride (SiNx) film by a photolithographic method.

The third source electrode 17 and the third drain electrode 20 are each connected to the oxide semiconductor layer 4 and, when the second transistor 32 is in an on state, a voltage is applied to the oxide semiconductor layer 4 between the third source electrode 17 and the third drain electrode 20, causing a source-drain current to flow. Each of the third source electrode 17 and the third drain electrode 20 is, for example, a titanium electrode, an aluminum electrode, or a copper electrode.

The third source electrode 17 can be provided to a fifth contact hole 25 passing through the fourth insulating film 8 and the protection film 28. The third drain electrode 20 can be provided to a sixth contact hole 26 passing through the fourth insulating film 8 and the protection film 28.

For example, by a photolithographic method, the third contact hole 23 and the fourth contact hole 24 are formed in the protection film 28 on the first source electrode 15 and on the first drain electrode 18, and the fifth contact hole 25 and the sixth contact hole 26 are formed by patterning the protection film 28/the fourth insulating film 8 on the source region and on the drain region of the oxide semiconductor layer 4. Subsequently, the second source electrode 16, the second drain electrode 19, the third source electrode 17, and the third drain electrode 20 can be formed by forming a layered film of titanium/aluminum/titanium on the protection film 28, within the third contact hole 23, within the fourth contact hole 24, within the fifth contact hole 25, and within the sixth contact hole 26 by sputtering, and patterning the layered film by a photolithographic method.

For example, a layered film including a Ti film (thickness: 30 nm) as a lower layer, an Al film (thickness: 300 nm) as a main layer, and a Ti film (thickness: 50 nm) as an upper layer can be used. Further, in the source electrode, the titanium film may be changed to a molybdenum film or a tungsten film, or the Al film may be changed to a Cu film. In the case of a Cu film, for example, the structure becomes a two-layer structure with the Ti film as the upper layer and the Cu film as the lower layer.

A flattening film 38 is provided on the first transistor 31 and on the second transistor 32. The flattening film 38 is, for example, a photosensitive polyimide film. For example, the flattening film 38 including a contact hole is formed on the second source electrode 16 and the second drain electrode 19 by applying a photosensitive polyimide resin onto the second source electrode 16, onto the second drain electrode 19, onto the third source electrode 17, onto the third drain electrode 20, and onto the protection film 28, and patterning the photosensitive polyimide resin.

An anode electrode 40 that connects the second drain electrode 19 of the first transistor 31 and the light-emitting layer 35 is provided on the flattening film 38. A light-emitting layer 35 and a cathode electrode are provided on the anode electrode 40. Further, an edge cover 41 is provided on the flattening film 38, around the light-emitting layer 35. The light-emitting layer 35 is, for example, an organic EL layer or an inorganic EL layer. The organic EL layer is, for example, an organic light-emitting diode (OLED). The inorganic EL layer is, for example, a quantum dot light-emitting diode (QLED). The anode electrode 40, the light-emitting layer 35, and the cathode electrode constitute the light-emitting element 34.

A sealing layer 42, a resin layer 43, a function layer 44, and a protection film 45 are provided above the light-emitting layer 35. The function layer 44 can include a touch panel and a polarizer.

Comparative Embodiment

Figure 5:
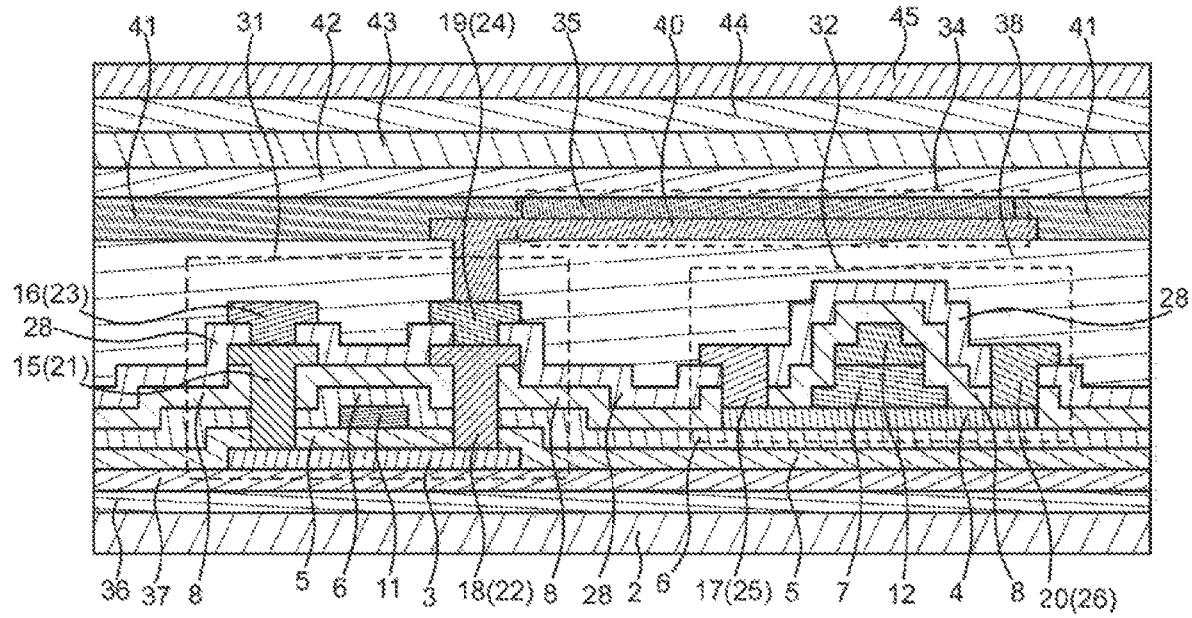
FIG. 5 is a schematic cross-sectional view of a display device of a comparative embodiment.

FIG. 5 is a schematic cross-sectional view of a display device of a comparative embodiment. In the comparative embodiment, the second insulating film 6, which is an SiNx film including hydrogen, is positioned above the first gate electrode 11 at the position of the first transistor 31, and is positioned below the oxide semiconductor layer 4 at the position of the second transistor 32. That is, the second insulating film 6 is provided overlapping the oxide semiconductor layer 4 included in the second transistor 32. Other configurations are the same as those in the first embodiment. With such a configuration, in the manufacturing process of the display device, the hydrogen included in the second insulating film 6 may reduce the oxide semiconductor layer 4, causing a change in the electrical resistivity of the oxide semiconductor layer 4. As a result, the possibility exists that the second transistor 32 will not be driven properly.

Second Embodiment

Figure 6:
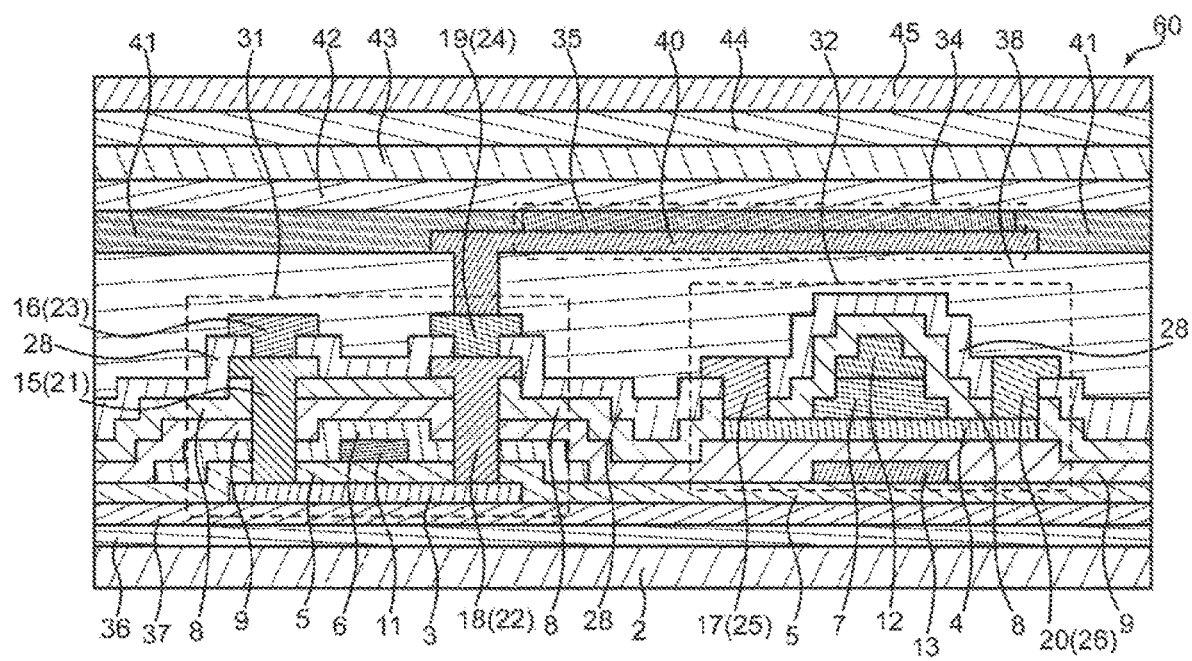
FIG. 6 is a schematic cross-sectional view of the display device of an embodiment of the disclosure.

The second transistor 32 included in the display device 60 of a second embodiment has a double gate structure. FIG. 6 is a schematic cross-sectional view of the display device 60 of the second embodiment.

The second transistor 32 includes a third gate electrode 13 between the first insulating film 5 and a fifth insulating film 9 directly below the oxide semiconductor layer 4. The third gate electrode 13 is the bottom gate electrode of the second transistor 32, and the fifth insulating film 9 functions as the gate insulating film of the bottom gate.

The third gate electrode 13 is, for example, a metal film such as titanium, aluminum, molybdenum, tungsten, copper, or the like, an alloy film of at least one of these metals, a layered film of at least two of the metals, a layered film of the metal and the alloy, or a layered film of at least two of the alloys.

The fifth insulating film 9 is positioned above the first gate electrode 11 at the position of the first transistor 31, and is positioned below the oxide semiconductor layer 4 at the position of the second transistor 32. The fifth insulating film 9 is, for example, an SiOx film.

A gate voltage is applied to the second gate electrode 12 and the third gate electrode 13, thereby forming a top gate side channel and a bottom gate side channel in the oxide semiconductor layer 4. Accordingly, the second transistor 32 is turned to an on state, making it possible to cause a source-drain current to flow to both the top gate side channel and the bottom gate side channel, and increase the source-drain current.

Other configurations and processes are the same as those in the first embodiment. Furthermore, the descriptions of the first embodiment apply to the second embodiment as well, unless a contradiction arises.

The invention claimed is:

1. A display device comprising:
   a substrate;
   a first transistor provided on the substrate; and
   a second transistor provided on the substrate, not overlapping the first transistor,
   wherein:
   the first transistor includes
   a polycrystalline silicon layer provided on the substrate,
   a first insulating film provided on the polycrystalline silicon layer,
   a first gate electrode provided on the first insulating film, and
   a second insulating film provided on the first gate electrode;
   the second transistor includes
   a third gate electrode provided on the first insulating film,
   a fifth insulating film provided on the third gate electrode,
   an oxide semiconductor layer provided on the fifth insulating film,
   a third insulating film provided on the oxide semiconductor layer, and
   a second gate electrode provided on the third insulating film;
   the first insulating film and the third insulating film are SiOx films;
   the second insulating film is an SiNx film including hydrogen, is provided overlapping the polycrystalline silicon layer, and is provided not overlapping the oxide semiconductor layer; and
   the fifth insulating film is provided on the first insulating film and the second insulating film.

2. The display device according to claim 1,
   wherein the second gate electrode is provided with a position of the second gate electrode being aligned with a position of the third insulating film.

3. The display device according to claim 1,
   wherein the second insulating film is provided in an island shape at a position of the first transistor.

4. The display device according to claim 1,
   wherein:
   the display device further includes a plurality of pixel circuits;
   each of the plurality of pixel circuits includes the first transistor; and
   the first transistor is a drive transistor.

5. The display device according to claim 4,
   wherein:
   each of the plurality of pixel circuits further includes the second transistor; and
   the second transistor includes a conduction terminal connected to a control terminal of the first transistor.

6. The display device according to claim 1, further comprising:
   a fourth insulating film provided on the fifth insulating film and on the second gate electrode,
   wherein:
   the first transistor further includes
   a first source electrode connected to the polycrystalline silicon layer and
   a first drain electrode connected to the polycrystalline silicon layer;
   the first source electrode is provided to a first contact hole passing through the first insulating film, the second insulating film, and the fourth insulating film; and
   the first drain electrode is provided to a second contact hole passing through the first insulating film, the second insulating film, and the fourth insulating film.

7. The display device according to claim 6, further comprising:
a protection film provided on the fourth insulating film, wherein:
the first transistor further includes
a second source electrode connected to the first source electrode and
a second drain electrode connected to the first drain electrode;
the second source electrode is provided to a third contact hole passing through the protection film; and
the second drain electrode is provided to a fourth contact hole passing through the protection film.

8. The display device according to claim 7, wherein:
the second transistor further includes
a third source electrode connected to the oxide semiconductor layer and
a third drain electrode connected to the oxide semiconductor layer;
the third source electrode is provided to a fifth contact hole passing through the fourth insulating film and the protection film; and
the third drain electrode is provided to a sixth contact hole passing through the fourth insulating film and the protection film.

9. A method for manufacturing a display device, comprising:
forming a first transistor and a second transistor on a substrate,
wherein:
forming the first transistor and the second transistor includes
forming a polycrystalline silicon layer on the substrate,
forming a first insulating film on the polycrystalline silicon layer,
forming a first gate electrode on the first insulating film,
forming a second insulating film on the first gate electrode,
forming a third gate electrode on the first insulating film,
forming a fifth insulating film on the third gate electrode,
forming an oxide semiconductor layer directly above the third gate electrode and the fifth insulating film,
forming a third insulating film on the oxide semiconductor layer, and
forming a second gate electrode on the third insulating film;
the polycrystalline silicon layer is a layer with a channel of the first transistor formed therein;
the oxide semiconductor layer is a layer with a channel of the second transistor formed therein;
the first insulating film and the third insulating film are SiOx films;
the second insulating film is an SiNx film including hydrogen; and
the oxide semiconductor layer is formed not overlapping the second insulating film.

* * * * *